(12) United States Patent
Saeki (10) Patent No.: US 7,459,348 B2
(45) Date of Patent: Dec. 2, 2008

(54) METHOD FOR MANUFACTURING A SEMICONDUCTOR DEVICE

(75) Inventor: Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 278 days.

(21) Appl. No.: 11/236,866

(22) Filed: Sep. 28, 2005

(65) Prior Publication Data

US 2006/0088957 A1    Apr. 27, 2006

(30) Foreign Application Priority Data

Oct. 8, 2004    (JP)    ............................. 2004-296731

(51) Int. Cl.
    *H01L 21/44* (2006.01)
(52) U.S. Cl. .................. 438/125; 438/112; 438/126
(58) Field of Classification Search .......... 257/E23.133; 438/125, 112, 126, 127
    See application file for complete search history.

(56) References Cited

U.S. PATENT DOCUMENTS

| 5,427,938 | A  | * | 6/1995 | Matsumura et al. ..... 264/272.17 |
| 5,766,982 | A  | * | 6/1998 | Akram et al. .................. 438/51 |
| 6,232,667 | B1 | * | 5/2001 | Hultmark et al. ............ 257/777 |
| 7,061,103 | B2 | * | 6/2006 | Chen et al. ................... 257/713 |
| 2002/0115237 | A1 | * | 8/2002 | Williams .................... 438/126 |

FOREIGN PATENT DOCUMENTS

JP    11-354552    12/1999

* cited by examiner

*Primary Examiner*—Tuan H Nguyen
(74) *Attorney, Agent, or Firm*—Rabin & Berdo, PC (57) ABSTRACT

A method for manufacturing a semiconductor device formed by stacking a plurality of semiconductor elements on a substrate includes the steps of stacking the plurality of semiconductor elements on the substrate to form plural stages, placing the substrate substantially vertically and charging an underfill agent into spaces defined between the substrate and the corresponding semiconductor element and spaces defined among the stacked semiconductor elements through a nozzle from above side faces of the stacked semiconductor elements, and curing the charged underfill agent.

7 Claims, 6 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device formed by stacking a plurality of semiconductor elements on a substrate.

2. Description of the Related Art

In a conventional method for manufacturing a semiconductor device, one semiconductor element is bonded face-down to electrodes provided on a carrier by means of its protruding electrodes. The carrier is tilted about 15° from the horizontal and a thermosetting liquid resin is injected into spaces between the carrier and the semiconductor element, which are defined by electrode bonding. Thereafter, the liquid resin is cured to seal the spaces defined by the electrode bonding, refer to, for example, Japanese Patent Application Laid-Open No. Hei 11 (1999)-354552, paragraphs 0022-0024 in the third page and FIG. 2.

It has recently been practice to stack a plurality of semiconductor elements on a substrate, electrically bond them to one another, and bring a semiconductor device into a large size and high functioning at low cost.

However, when an attempt to seal a plurality of spaces defined by stacking a plurality of semiconductor elements is made using the above prior art, electrodes of the lowest-stage semiconductor element are bonded to a substrate and a liquid resin is injected into the spaces and then cured. Thereafter, electrodes of the next-stage semiconductor element are bonded onto the lowest-stage semiconductor element, and the liquid resin is injected into spaces defined between the two semiconductor elements and cured. This is repeated in turn to fabricate a semiconductor device.

A problem arises in that, according to such a manufacturing method, after the liquid resin extruded from each space has been cured, the liquid resin extruded from the next space is superimposed thereon and cured, and when an interface is formed between these layers and peeling occurs in the interface, corrosion of electrodes or the like occurs due to moisture absorption from the peeled interface.

Also a problem arises in that moisture that remains at the peeled interface expands due to heating in a reflow process at secondary mounting of the semiconductor device, thereby causing breakage of a junction between the electrodes.

Further, a problem arises in that since the peeled interface has no bonding force, stress due to the difference in thermal expansion between a metal material and the cured liquid resin from heat generated by the semiconductor device occurs in the junction between the electrodes, thus causing breakage of the junction between the electrodes due to thermal cycles.

Furthermore, a problem arises in that since the liquid resin extruded from each space is cured and the liquid resin is superimposed thereon in turn to seal the spaces among the semiconductor elements or the like, the extruded liquid resin expands over the substrate in turn and a relatively large area for placing the extruded liquid resin is needed, thus making it difficult to bring a semiconductor device into lesser size.

A problem arises in that when one attempts to inject the liquid resin into the plural spaces one at a time in order to cope with such a problem, it is difficult to uniformly inject the liquid resin into the respective spaces even though the carrier is tilted about 15° from the horizontal, and a sealing failure occurs in each space in which the amount of injected the liquid resin is insufficient.

The present invention has been made to solve the foregoing problems. It is therefore an object of the present invention to provide a means which is capable of uniformly injecting a liquid resin into spaces such as spaces among a plurality of semiconductor elements, which are formed by stacking the plurality of semiconductor elements, and which prevents the formation of an interface between layers each formed by the post-curing liquid resin.

SUMMARY OF THE INVENTION

In order to solve the above problems, the present invention provides a method for manufacturing a semiconductor device formed by stacking a plurality of semiconductor elements on a substrate, which comprises the steps of stacking the plurality of semiconductor elements on the substrate to form plural stages, placing the substrate substantially vertically and charging a liquid resin into spaces defined between the substrate and the corresponding semiconductor element and spaces defined among the stacked semiconductor elements from above side faces of the stacked semiconductor elements, and curing the charged liquid resin.

Thus, the present invention is capable of obtaining advantageous effects in that a liquid resin can be injected into all spaces in one process at a time, the liquid resin can uniformly be charged into all the spaces, and an interface can be prevented from being formed between the post-curing liquid resins.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Semiconductor devices according to the present invention and manufacturing methods thereof will hereinafter be described with reference to the accompanying drawings.

First Preferred Embodiment

Figure 1A:
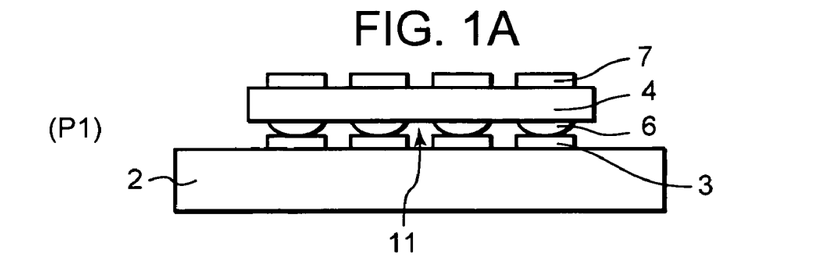
FIGS. 1A-1D show an explanatory diagram of a process for manufacturing a semiconductor device according to a first embodiment.
Figure 1B:
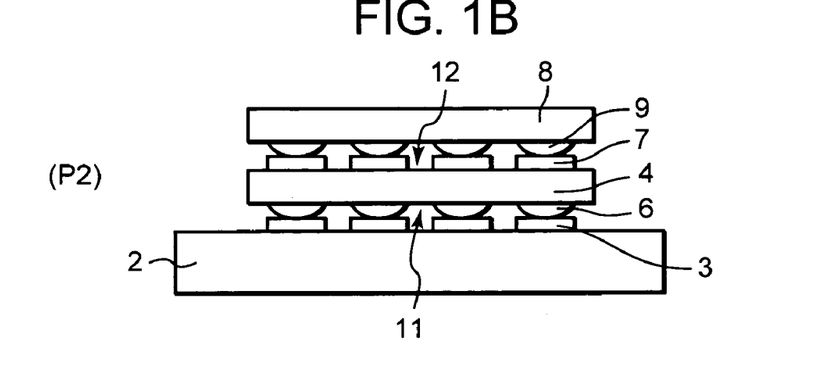
Figures 1C, 1D:
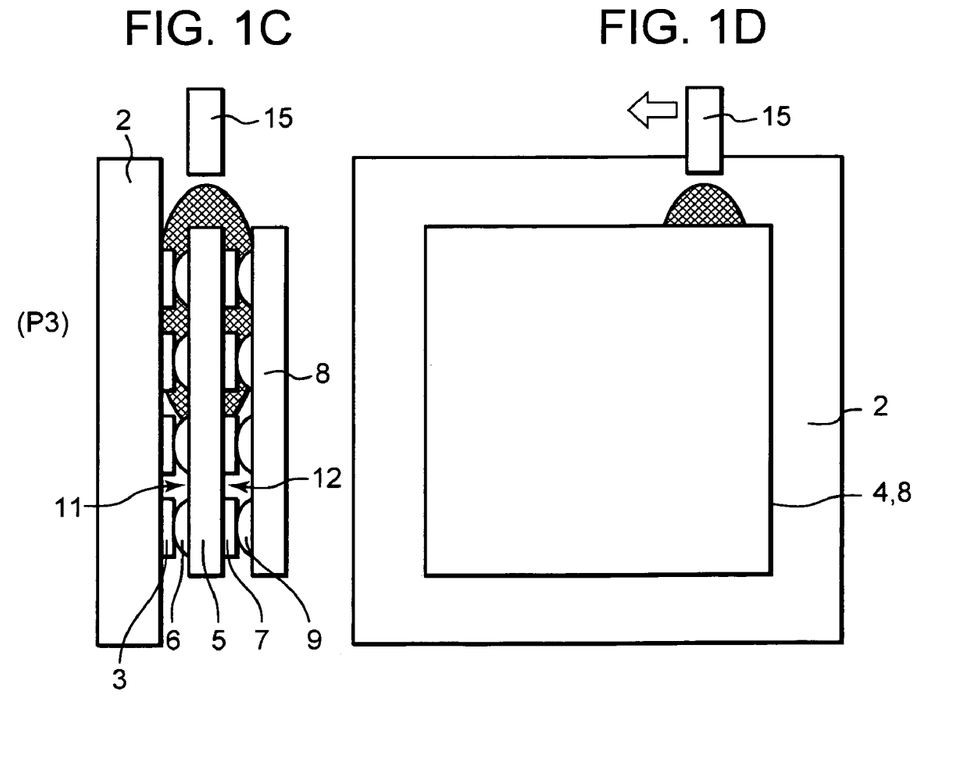
Figure 2:
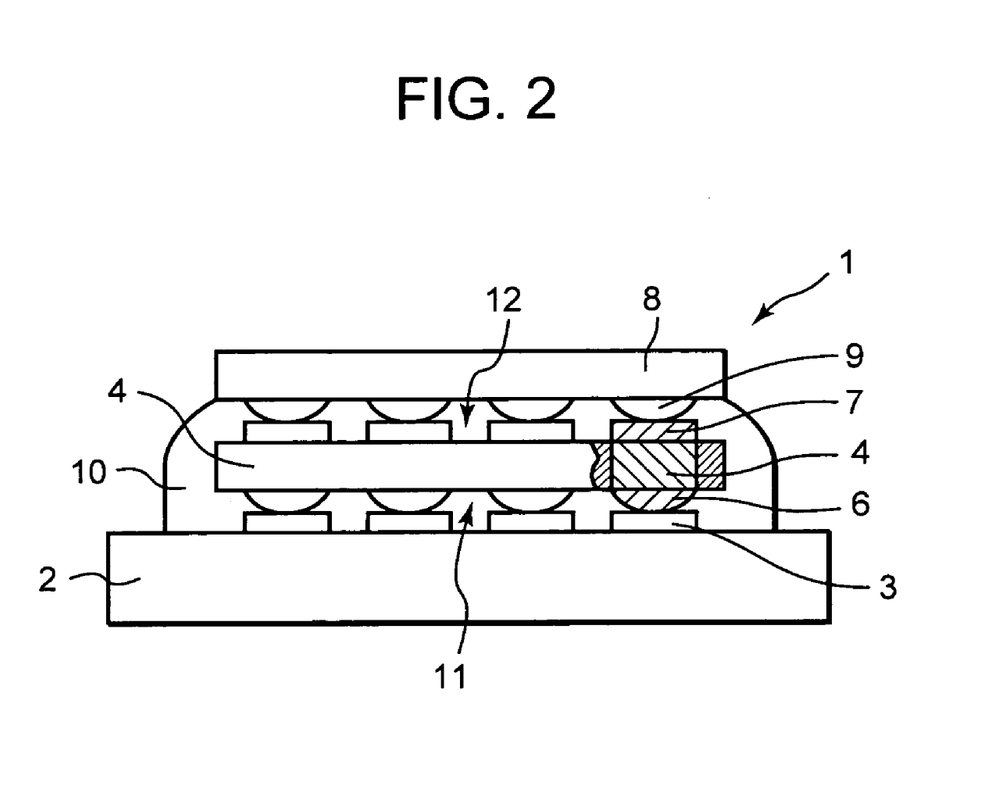
FIG. 2 is an explanatory diagram illustrating the semiconductor device according to the first embodiment.

FIGS. 1A-1D show an explanatory diagram of a process for manufacturing a semiconductor device according to a first embodiment, and FIG. 2 is an explanatory diagram illustrating the semiconductor device according to the first embodiment, respectively.

In FIG. 2, reference numeral 1 indicates the semiconductor device. The present embodiment shows a semiconductor device formed by stacking semiconductor elements on a substrate in two stages.

Reference numeral 2 indicates the substrate, which is a circuit substrate or a semiconductor element or the like. The substrate is provided with a plurality of ball pads 3 whose surfaces are plated with nickel or the like.

Reference numeral 4 indicates a first semiconductor element, which is a substantially square semiconductor element disposed in an intermediate stage. The first semiconductor element 4 is provided with bumps 6 formed by fusion-bonding solder or the like to ends on the front-face (corresponding to a surface on the formed side of an active circuit, of the semiconductor element 4) sides of through electrodes 5 formed by embedding a metal such as copper into a plurality of through holes extending therethrough in the direction of the thickness thereof, and ball pads 7 formed by plating nickel or the like onto ends of the through electrodes 5 on the back sides thereof. The bumps 6 and the ball pads 7 are provided in a state in which they are electrically brought into conduction by the through electrodes 5.

Further, the bumps 6 and the ball pads 7 are internally connected to their corresponding predetermined portions of an active circuit (not shown) formed in the first semiconductor element 4.

In the first semiconductor element 4 disposed in the intermediate stage as described above, the front and back surfaces thereof are respectively formed with electrodes.

Reference numeral 8 indicates a second semiconductor element, which is a substantially square semiconductor element disposed in the top stage and is provided with a plurality of bumps 9 formed by fusion-bonding solder or the like to the front face (corresponding to a surface on the formed side of an active circuit, of the semiconductor element 8) thereof. The bumps 9 are internally connected to their corresponding predetermined portions of the active circuit (not shown) formed in the second semiconductor element 8.

In the second semiconductor element 8 disposed in the top stage as described above, only the front face thereof is formed with electrodes.

Reference numeral 10 indicates an underfill, which is formed by curing a thermosetting and relatively low-viscocity liquid resin (called underfill agent) injected into both first spaces 11 formed by bonding the ball pads 3 of the substrate 2 and the bumps 6 of the first semiconductor element 4 and second spaces 12 defined by bonding the ball pads 7 of the first semiconductor element 4 and the bumps 9 of the second semiconductor element 8. The underfill 10 seals the first spaces 11 and the second spaces 12.

In FIG. 1, reference numeral 15 indicates a nozzle provided with a discharge port for discharging an underfill agent supplied from an unillustrated underfill agent supply device. The nozzle 15 is moved in an X-Y-Z direction by a moving mechanism (not shown).

The size of the discharge port of the nozzle 15 is set in such a manner that the underfill agent can simultaneously be injected into all the spaces (corresponding to both of the first and second spaces 11 and 12 in the present embodiment) in such a range that the underfill agent is not round-intruded into the back surface of the second semiconductor element 8, i.e., the top-stage semiconductor element.

A method for manufacturing the semiconductor device according to the present embodiment in accordance with processes indicated by P will be explained below using FIG. 1.

In the process P1, the front face of a first semiconductor element 4 is opposed to its corresponding front face of a substrate 2. Then, bumps 6 provided on the front face of the first semiconductor element 4 are bonded to their corresponding ball pads 3 provided on substrate 2 to flip-chip bond the first semiconductor element 4 onto the substrate 2. Thus, first spaces 11 are defined between the front face of the substrate 2 and the front face of the first semiconductor element 4.

In the process P2, the front face of a second semiconductor element 8 is made opposite to the back surface of the first semiconductor element 4 after the first semiconductor element 4 has been bonded to the substrate 2. Then, bumps 9 provided on the front face of the second semiconductor element 8 are bonded to their corresponding ball pads 7 of the first semiconductor element 4 to flip-chip bond the second semiconductor element 8 onto the first semiconductor element 4. Thus, second spaces 12 are defined between the back surface of the first semiconductor element 4 and the front face of the second semiconductor element 8.

In the process P3, in a state in which the first semiconductor element 4 and the second semiconductor element 8 are bonded onto and stacked over the substrate 2 and formed in two stages, the substrate 2 is vertically disposed as shown in FIG. 1, and side faces of one side of each of the semiconductor elements 4 and 8 are placed horizontally.

While a nozzle 15 is set vertically from the side of the upper one side face of the horizontalized two side faces of the first and second semiconductor elements 4 and 8 and horizontally moved along the one side face toward the endpoint of the other end with one end of the one side face thereof as a start point, an underfill agent indicated by hatching in FIG. 1 is injected into the first and second spaces 11 and 12 through the nozzle 15 and intruded therein through the use of its own weight or the like, whereby the underfill agent is charged into the first and second spaces 11 and 12 while being slightly extruded from the side face opposite to the upper one side face.

After the underfill agent has been charged therein, substrate 2 is placed horizontally and the underfill agent is cured by heating or the like under inline or batch processing to thereby form an underfill 10.

The semiconductor device 1 according to the present embodiment is manufactured as described above. If the liquid underfill agent is injected into all the spaces prior to its curing process and thereafter cured in this way, no interface is formed in the post-curing underfill. It is thus possible to prevent breakage of junctions among electrodes, i.e., ball pads and bumps, due to corrosion caused by moisture absorption and the expansion of moisture that remains at the interface, with formation of an interface, and breakage of junctions among electrodes due to the difference in thermal expansion between a metal material for the electrodes and the underfill.

In the present embodiment as described above, the underfill agent is charged into the spaces defined between the substrate and the first semiconductor element and the spaces defined between the first and second semiconductor elements from above the side faces of the semiconductor elements stacked over the substrate in two stages in advance and thereafter cured. Thus, the underfill agent can be injected into the two spaces in one process at a time and uniformly charged into the two spaces. It is further possible to prevent an interface from being formed during the post-curing of the underfill.

Since there is no need to simultaneously inject the underfill agent from the respective spaces and laminate the underfill agents extruded from the spaces while curing the same in order, the area for placing the extruded underfill agent can be reduced, thereby making it possible to miniaturize the semiconductor device.

Further, the underfill agent is simultaneously injected into all the spaces (two points in the present embodiment). Thus, the time required to perform the process of injecting the underfill agent can be shortened and the efficiency of manufacture of the semiconductor device can be enhanced.

In the present embodiment in addition to the above, the substrate is vertically disposed and side faces of one side of the stacked semiconductor elements are horizontally placed. The underfill agent is injected from one side face side disposed thereabove. Consequently, the underfill agent can be injected into the two spaces from one side face side under the same condition. The underfill agent can uniformly be charged into the two spaces. It is also possible to prevent an interface from being formed in the cured underfill.

Second Preferred Embodiment

FIG. 3 is an explanatory diagram showing a process for manufacturing a semiconductor device according to a second embodiment.

Incidentally, portions similar to those employed in the first embodiment are given the same reference numerals and their explanations are omitted.

The semiconductor device 1 according to the present embodiment is similar to the first embodiment. A nozzle 15 is also similar in configuration to that employed in the first embodiment.

A method for manufacturing the semiconductor device according to the present embodiment in accordance with processes indicated by PA1-PA3 will be explained below using FIGS. 3A-3D.

Figure 3A:
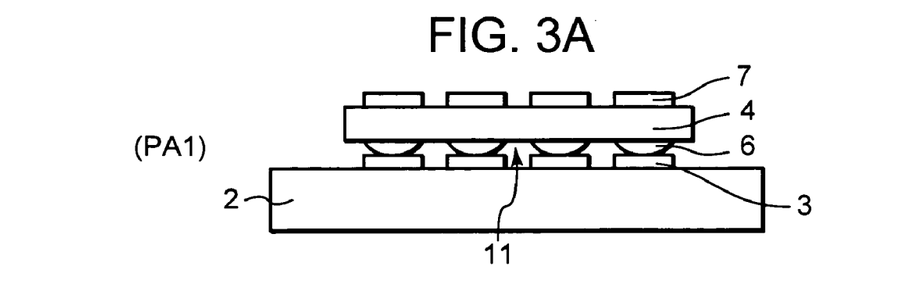
FIGS. 3A-3D show an explanatory diagram of a process for manufacturing a semiconductor device according to a second embodiment.
Figure 3B:
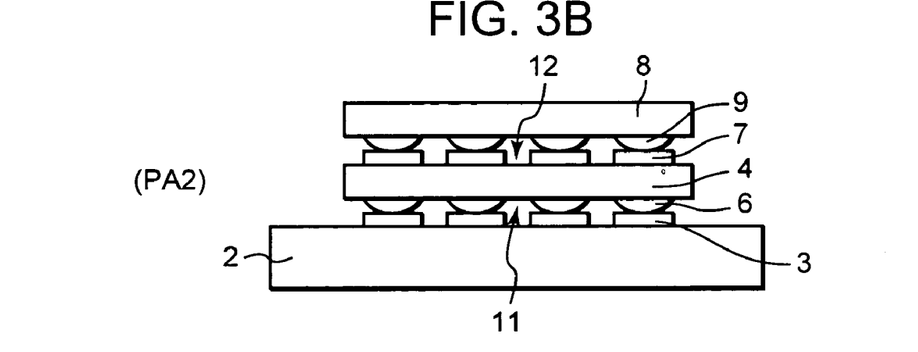

Since the processes PA1 and PA2 of the present embodiment are similar to the processes P1 and P2 of the first embodiment, their explanations are omitted.

Figure 3C:
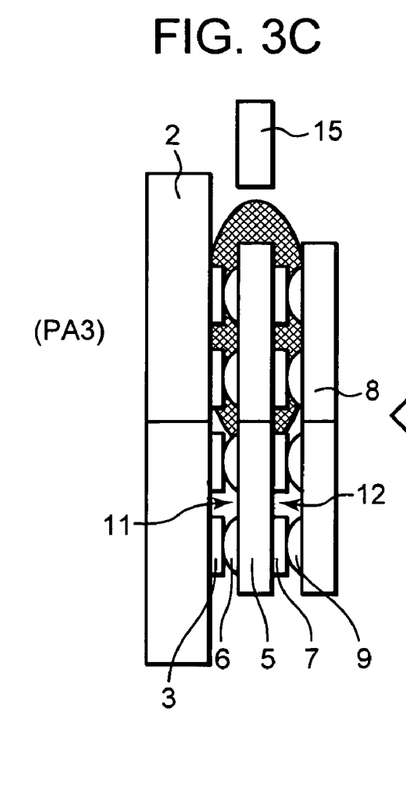

In the process PA3, a first semiconductor element 4 and a second semiconductor element 8 are bonded onto and stacked over a substrate 2 and formed in two stages. In such a state, the substrate 2 is vertically placed as shown in FIG. 3C, and side faces of one side of semiconductor elements 4 and 8 are placed aslant as viewed from the horizontal.

It is desirable that the tilt angles of the first and second semiconductor elements 4 and 8 in this case are set in such a manner that diagonal lines of the substantially square semiconductor elements are made vertical (i.e., reach approximately 45° if they are substantially a regular tetragon).

While the nozzle 15 is made vertical from the sides of upper two side faces of four side faces tilted from the horizontal, of the respective first and second semiconductor elements 4 and 8 and horizontally moved toward the endpoint of an end of the other of the two side faces with an end of the one side face thereof as a start point, an underfill agent indicated by hatching in FIG. 3 is injected into first and second spaces 11 and 12 through the nozzle 15 and intruded therein through the use of its own weight or the like, whereby the underfill agent is charged into the first and second spaces 11 and 12 while being slightly extruded from the two side faces opposite to the upper two side faces.

Figure 3D:
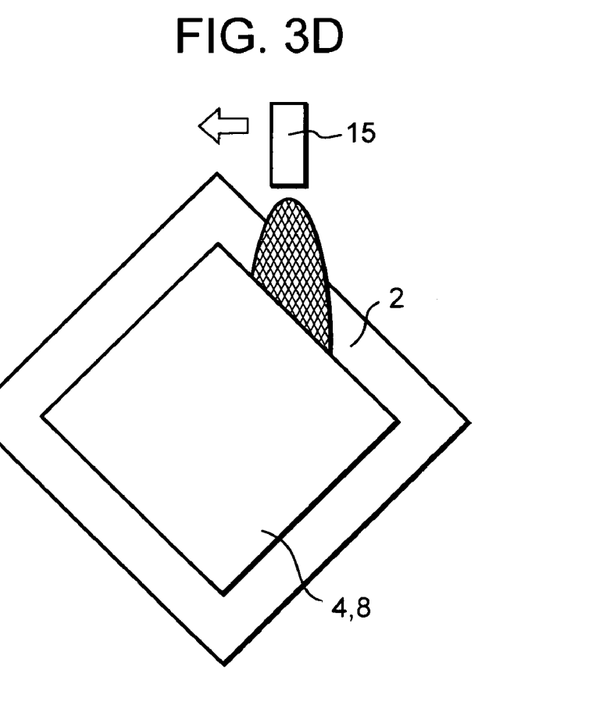

After the underfill agent has been charged therein, the underfill agent is cured in a manner similar to that of the first embodiment to form an underfill 10.

As described above, the liquid underfill agent is injected into all the spaces prior to its curing process to fabricate the semiconductor device 1 according to the present embodiment.

In the present embodiment in addition to an effect similar to the first embodiment as described above, the two side faces of the stacked semiconductor elements are tilted and the underfill agent is injected from the sides of the two side faces disposed thereabove. Thus, the underfill agent can be injected into the two spaces from the two side faces of the semiconductor elements at a time. Hence the time required to inject the underfill agent can be shortened.

Incidentally, the present embodiment has described the case in which the underfill agent is injected while the nozzle is being horizontally moved from the end of one of the upper two side faces. However, the underfill agent may be injected while the nozzle is being moved along the upper two side faces from the end of one of the two side faces. In this case, the direction of a discharge port of the nozzle may be made vertical or opposite to the side faces along which the nozzle is moved, or may be its intermediate direction.

Third Preferred Embodiment

Figure 4A:
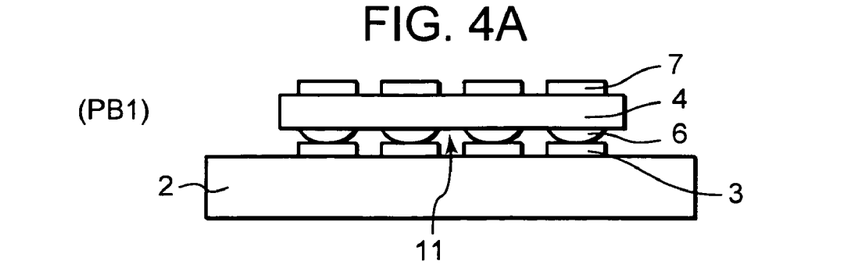
FIGS. 4A-4D illustrate an explanatory diagram (part 1) of a process for manufacturing a semiconductor device according to a third embodiment.
Figure 4B:
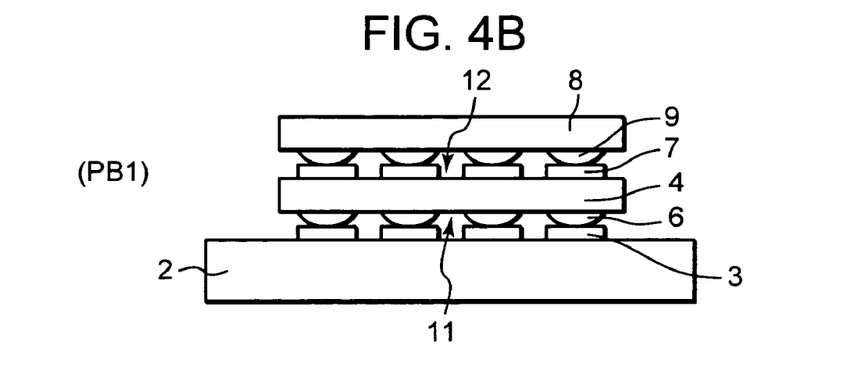
Figure 4C:
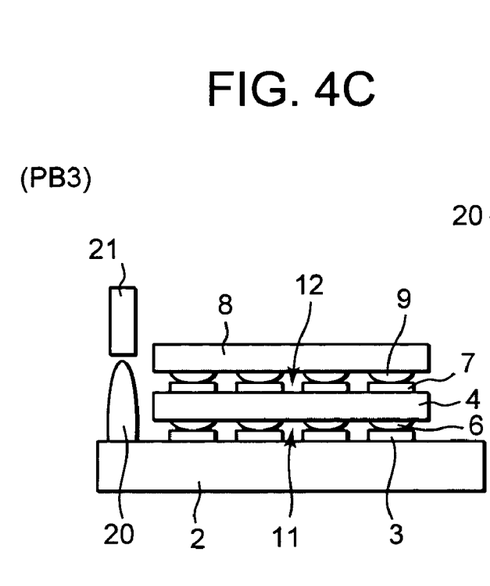
Figure 4D:
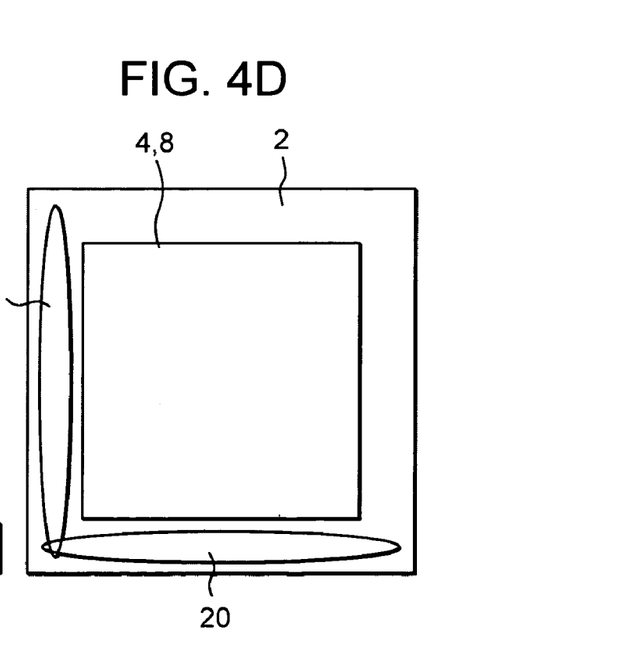
Figure 5A:
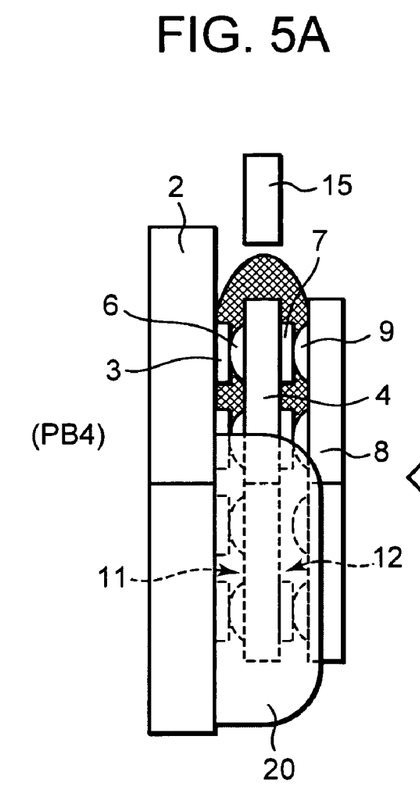
FIGS. 5A and 5B show an explanatory diagram (part 2) of the process for manufacturing the semiconductor device according to the third embodiment.
Figure 5B:
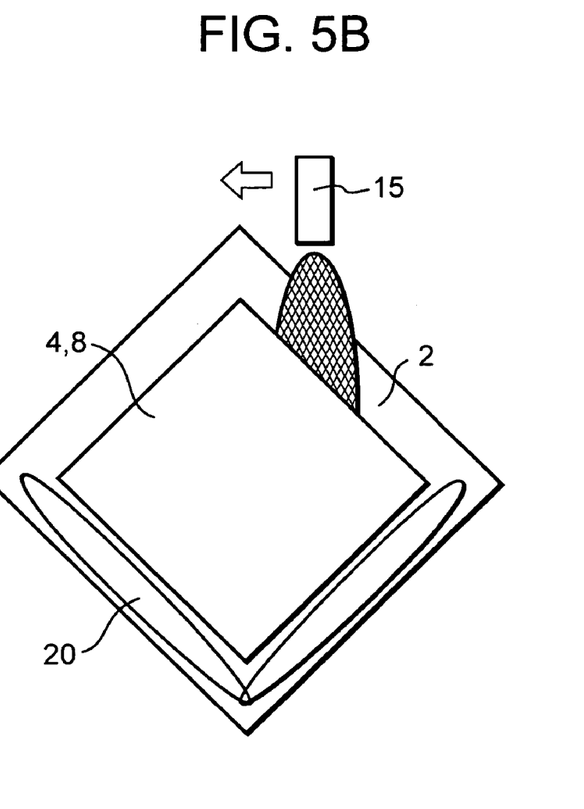

FIGS. 4A-4D show an explanatory diagram of a process PB1-PB3 (part 1) for manufacturing a semiconductor device according to a third embodiment, and FIGS. 5A and 5B show an explanatory diagram of a process PB4 (part 2) for manufacturing the semiconductor device according to the third embodiment, respectively.

Incidentally, portions similar to those employed in the first embodiment are given the same reference numerals and their explanations are omitted.

The semiconductor device 1 according to the present embodiment is similar to that according to the first embodiment. A nozzle 15 is similar in configuration to that employed in the second embodiment.

In FIG. 4, reference numerals 20 indicate dam members, which are bank-shaped members for preventing an outflow of an underfill agent due to the extrusion of the underfill agent in the process of injecting the underfill agent. The dam members are formed by horizontally disposing a substrate 2 in a state in which first and second semiconductor elements 4 and 8 are bonded onto and stacked on the substrate 2 and formed in two stages, applying a thermosetting and relatively high-viscocity liquid resin (called dam agent) in raised form to the neighborhood of side faces of the first and second semiconductor elements 4 and 8 on the extruded side of the underfill agent through a dam nozzle 21 in the process of injecting the underfill agent so as to extend along their side faces, and curing the resin at such a height as to be substantially equal to the post-stacking height of the stacked semiconductor elements (first and second semiconductor elements 4 and 8 in the present embodiment).

In the case of the dam members 20 shown in FIG. 4, which are employed in the manufacturing process of the second embodiment, for example, the dam members are formed by applying a dam agent with being raised in the form of a substantially L shape to the neighborhood of the sides opposite to the tilted upper two side faces, i.e., the tilted lower two side faces so as to extend along the two side faces and thereafter curing the same.

Incidentally, each dam member 20 employed in the manufacturing process of the first embodiment is formed by applying a dam agent with being raised in the form of a substantially character of 1 to the neighborhood of the opposite side of the horizontalized upper one side face of each semiconductor element, i.e., the horizontal lower side face thereof so as to extend along the lower side face thereof and thereafter curing the same.

A method for manufacturing the semiconductor device according to the present embodiment in accordance with processes indicated by PB1-PB4 will be described below using FIGS. 4A-4D, 5A and 5B.

Since the processes of PB1 and PB2 in the present embodiment are similar to those of P1 and P2 in the first embodiment, their explanations are omitted.

In the process of PB3, a substrate 2 is horizontally disposed as shown in FIG. 4 in a state in which first and second semiconductor elements 4 and 8 are bonded onto and stacked on the substrate 2 and formed in two stages. Then, a discharge port of a dam nozzle 21 is moved on a horizontal plane with being opposite to the substrate 2 so as to travel along lower two side faces of the first and second semiconductor elements 4 and 8, which are tilted in an underfill agent injecting process corresponding to the next process, in the neighborhood of the lower two side faces. Further, a dam agent is applied so as to be raised in a substantially L form and thereafter cured to form each substantially L-shaped dam member 20.

In the process of PB4, side faces of one side of the first and second semiconductor elements 4 and 8 are tilted from the horizontal in a state in which the first and second semiconductor elements 4 and 8 are bonded onto and stacked on the substrate 2, and formed in two stages in a manner similar to the process of PA3 in the second embodiment. Then, substantially L-shaped dam members 20 are placed in a formed state in the neighborhood of the tilted lower two side faces of the semiconductor elements 4 and 8.

In a manner similar to the process of PA3 in the second embodiment, an underfill agent indicated by hatching in FIG. 5 is injected into first and second spaces 11 and 12 from the sides of the tilted upper two side faces while a nozzle 15 is being horizontally moved. The underfill agent is caused to reach the substantially L-shaped dam members 20 extending along the lower two side faces, after which the underfill agent is charged into the first and second spaces 11 and 12.

After the charging of the underfill agent therein, the underfill agent is cured in a manner similar to that of the first embodiment to form an underfill 10.

After the dam members 20 have been formed as described above, the liquid underfill agent is injected into all spaces prior to its curing process to fabricate the semiconductor device 1 according to the present embodiment. Extruded portions of the underfill 10 of the semiconductor device 1 according to the present embodiment are formed of the dam members 20 as portions equivalent to the two side faces (one side face in the first embodiment).

In the present embodiment as described above, the dam members for preventing the outflow of the underfill agent are formed in the neighborhood of the side faces lying on the opposite sides of the side faces for injection of the underfill agent along the side faces prior to the injecting process of the underfill agent. It is thus possible to prevent the underfill agent from hanging down and from being round-intruded into the back surface of the substrate, in addition to advantageous effects similar to the first and second embodiments.

Fourth Preferred Embodiment

FIGS. 6A-6D shows an explanatory diagram showing of a process for manufacturing a semiconductor device according to a fourth embodiment.

Incidentally, portions similar to those employed in the first embodiment are given the same reference numerals and their explanations are omitted.

The semiconductor device 1 according to the present embodiment is similar to that according to the first embodiment. A nozzle 15 is similar in configuration to that employed in the second embodiment.

In FIG. 6, reference numeral 25 indicates a jig, which is made up of a metal material or a ceramic material or the like. This is a plate-like member having a thickness substantially equal to a post-stack height of stacked semiconductor elements (first and second semiconductor elements 4 and 8 in the present embodiment). The jig 25 is formed with contact surfaces 26 brought into contact with their corresponding side faces of the semiconductor elements on the extruded side of an underfill agent in the process of injecting the underfill agent. Discharge holes 27, which are respectively made open in respective spaces (first and second spaces 11 and 12 in the present embodiment) at the contact surfaces and communicate with the outside, are provided for every space.

In the case of the jig 25 employed in the manufacturing process of the second embodiment, which is shown in FIG. 6, for example, substantially V-shaped contact surfaces 26 brought into contact with the opposite sides of the tilted upper two side faces, i.e., tilted lower two side faces are formed. Discharge holes 27, which are made open in their corresponding first and second spaces 11 and 12, and which discharge air from the spaces to the outside, are provided at the contact surfaces 26 in the neighborhood of their corners.

Incidentally, in the case of the jig 25 employed in the manufacturing process of the first embodiment, contact surfaces 26 brought into contact with the opposite sides of the horizontalized upper side faces of one side of the semiconductor elements, i.e., the horizontal lower side faces of one side are formed. One or plural discharge holes 27, which are made open in their corresponding first and second spaces 11 and 12 and discharge air from the spaces to the outside, are provided at the contact surfaces 26.

A method for manufacturing the semiconductor device according to the present embodiment in accordance with processes indicated by PC1-PC3 will be explained below using FIGS. 6A-6D.

Figure 6A:
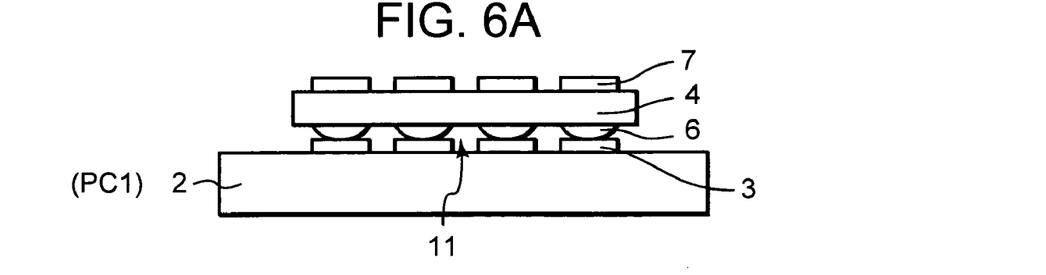
FIGS. 6A-6D depict an explanatory diagram of a process for manufacturing a semiconductor device according to a fourth embodiment.
Figure 6B:
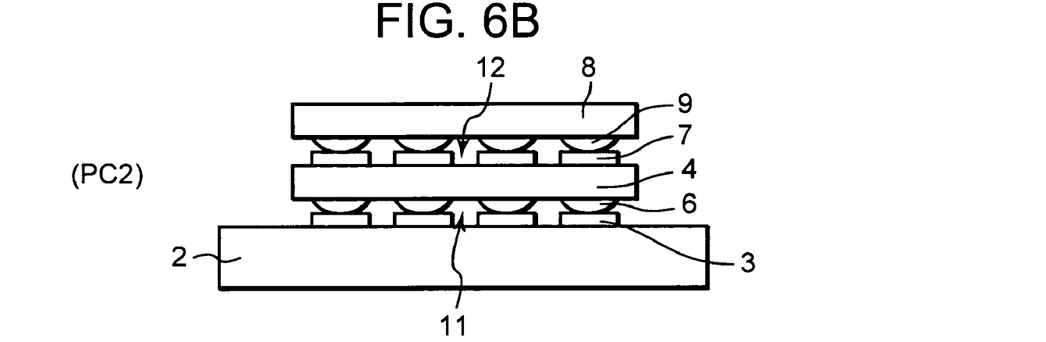

Since the processes of PC1 and PC2 in the present embodiment are similar to the processes of P1 and P2 in the first embodiment, their explanations are omitted.

Figure 6C:
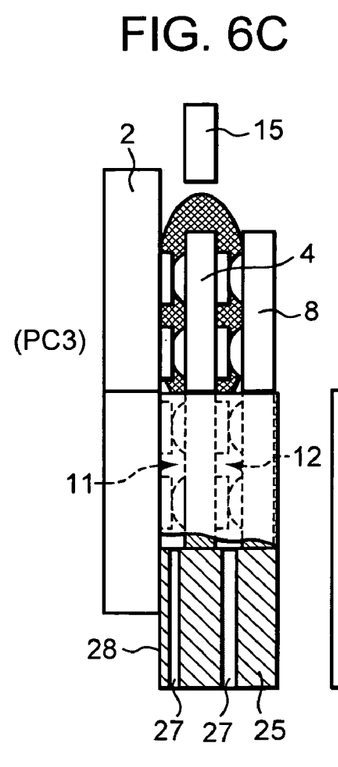
Figure 6D:
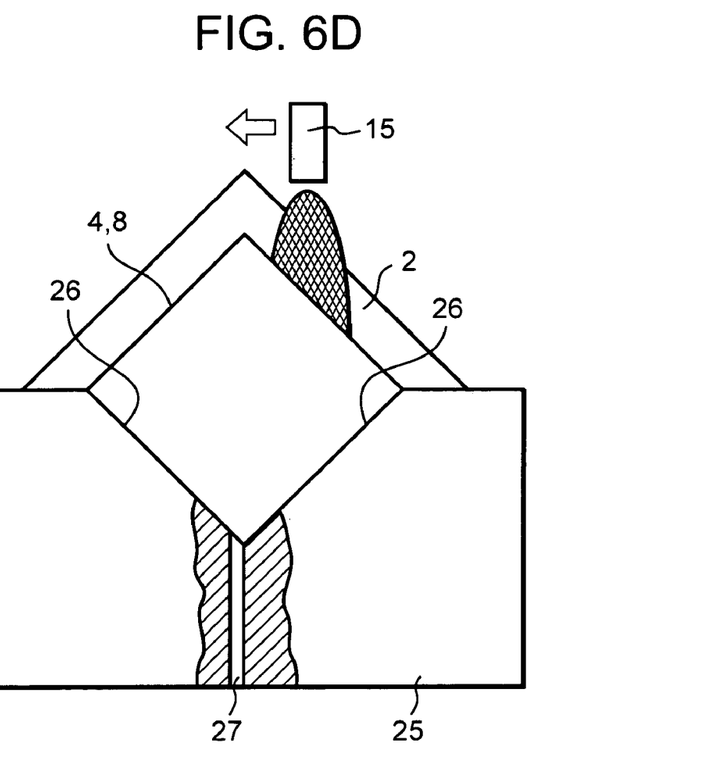

In the process of PC3, one side faces of first and second semiconductor elements 4 and 8 are placed aslant from the horizontal in a state in which the first and second semiconductor elements 4 and 8 are bonded onto and stacked on a substrate 2 and formed in two stages in a manner similar to the process of PA3 in the second embodiment. Contact surfaces 26 of a jig 25 are provided so as to be brought into contact with their corresponding tilted lower two side faces, and a bottom face 28 of the jig 25 is provided so as to contact the substrate 2.

Then, an underfill agent indicates by hatching in FIGS. 6C and 6D is injected into first and second spaces 11 and 12 through the nozzle 15 while the nozzle 15 is being moved horizontally from the sides of the tilted upper two side faces, in a manner similar to the process of PA3 in the second embodiment.

Even though, at this time, air that the underfill agent forces downward by its own weight or the like is discharged to the outside through the discharge holes 27 of the jig 25, which are made open in the respective spaces, and the lower two side faces of the first and second semiconductor elements 4 and 8 are covered with their corresponding contact surfaces 26 of the jig 25, the mixing of air into the underfill agent is prevented even if there is a difference in falling speed of the underfill agent, and the occurrence of voids in the post-curing underfill can be prevented.

Thus, the underfill agent is intruded into the first and second spaces 11 and 12, and reaches the contact surfaces 26 of jig 25, which are brought into contact with the two side faces on the sides opposite to the upper two side faces, whereby the underfill agent is charged into the first and second spaces 11 and 12.

After the charging of the underfill agent therein, the jig 25 is detached and thereafter the underfill agent is cured in a manner similar to the first embodiment to form an underfill 10.

Incidentally, the jig 25 employed in the process of injecting the underfill agent is used repeatedly by cleaning the discharge holes 27 by ultrasonic cleaning or pressurized air in each case or as needed.

As described above, the jig 25 is brought into contact with the stacked semiconductor elements and thereafter the liquid underfill agent is injected into all the spaces prior to its curing process to thereby manufacture the semiconductor device 1 according to the present embodiment.

In the present embodiment as described above, the jig brought into contact with the lower side faces of the stacked semiconductor elements is provided with the discharge holes prior to the injecting process of the underfill agent. Thus, in addition to advantageous effects similar to those obtained in the first and second embodiments, the mixing of air into the underfill agent in the injecting process of the underfill agent can be prevented, and the occurrence of voids in the underfill can be prevented.

Incidentally, each of the embodiments has described the case in which the nozzle is moved only once from the side of the upper one side face of each semiconductor element or the sides of the two side faces thereof to inject the underfill agent. However, the nozzle may be moved forward and backward alternately to inject the underfill agent. Alternatively, it may be feasible to temporarily stop the delivery of the underfill agent after the nozzle is moved once, return the nozzle to its start point, and move it while the underfill agent is being injected again (called "intermittent movement").

Although a description has been made of the case in which the substrate has been placed vertically, it may be made substantially vertical, that is, it may be displaced more or less in setting angle due to a device error or the like. In this case, the substrate may preferably be slightly tilted in a substrate direction (counterclockwise as viewed in the drawing on the left side of FIG. 1 (P3), for example) with respect to vertical in such a manner that the underfill agent does not flow into the back surface of the second semiconductor element.

Further, although a description has been made of the case in which the direction to discharge the underfill agent through the nozzle is set vertically, the nozzle may be tilted in the direction to head for the substrate.

Furthermore, although a description has been made of the case in which the size of the discharge port of the nozzle is set such that the underfill agent can simultaneously be injected into all the spaces, advantageous effects similar to those obtained in the respective embodiments can be obtained even though the nozzle is set to such a size that the underfill agent can be injected into one space alone, and the underfill agent is injected into all the spaces while the nozzle is being moved forward and backward alternately for each space or intermittently moved with being returned to a position corresponding to a start point for the following space.

In brief, it is important to charge the underfill agent into all the spaces prior to the curing process of the underfill agent and avoid the underfill agent from being round intruded into the back surface of the semiconductor element corresponding to the top stage. If such a method as to be able to do so is taken, then advantageous effects similar to those obtained in the respective embodiments can be obtained even if any method is used.

Although each of the above embodiments has described, as an example, the semiconductor device in which the semiconductor elements are stacked on the substrate in two stages, advantageous effects similar to those obtained in the respective embodiments can be brought about even if the present invention is applied to a semiconductor device wherein semiconductor elements are stacked in three or more stages. In this case, the semiconductor device is configured wherein only the semiconductor element corresponding to the top stage is used as the second semiconductor element and the plurality of semiconductor elements disposed between the second semiconductor element and the substrate are stacked in three or more stages as the first semiconductor elements.

Although a description has been made of the case in which the bumps and ball pads of the first semiconductor element are connected using the through electrodes, the connections therebetween are not limited to it. If such ones as to make it possible to electrically connect the bumps and ball pads of the first semiconductor element are taken, then any one may be used.

Further, although a description has been made of the first semiconductor element wherein the bumps are bonded toward the substrate side, the bumps may be bonded toward the side opposite to the substrate.

Furthermore, although a description has been made of the case in which the first semiconductor element is formed with the bumps and ball pads, the bumps are provided on the front face and back surface of the first semiconductor element, and these bumps and bumps of another first semiconductor element may be bonded to one another.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method for manufacturing a semiconductor device formed by stacking a plurality of semiconductor elements on a substrate, comprising, in the order recited, the steps of:
   stacking the plurality of semiconductor elements on the substrate to form plural stages of stacked semiconductor elements;
   placing the substrate substantially vertically;
   charging a liquid resin into spaces defined between the substrate and the plurality of semiconductor elements and into spaces defined among the stacked semiconductor elements from above the side faces of the stacked semiconductor elements; and
   curing the charged liquid resin.

2. The method according to claim 1, wherein when the substrate is placed substantially vertically, and wherein side faces of the stacked semiconductor elements are disposed horizontally.

3. The method according to claim 1, wherein when the substrate is placed substantially vertically, and wherein side faces of the stacked semiconductor elements are disposed aslant from horizontal.

4. The method according to claim 1, wherein in the step for charging the liquid resin, the liquid resin is simultaneously injected into the respective spaces.

5. The method according to claim 1, wherein in the step for charging the liquid resin, the liquid resin is injected into every respective space.

6. The method according to claim 1, further comprising prior to charging the liquid resin, forming dam members for preventing an outflow of the liquid resin from regions of side faces lying on sides opposite to the side faces for charging of the liquid resin so the dam members extend along the side faces lying on sides opposite to the side faces for charging of the liquid resin.

7. The method according to claim 1, further comprising the steps of:
providing a jig equipped with contact surfaces, which are brought into contact with side faces lying on sides opposite to the side faces for charging of the liquid resin, and discharge holes, which are made open at the contact surfaces and from which air is discharged from within the respective spaces; and
bringing the contact surfaces of the jig into contact with the side faces lying on the sides opposite to the side faces for charging of the liquid resin prior to the charging of the liquid resin.

* * * * *